(12) United States Patent
Wu et al.

(10) Patent No.: US 12,243,779 B2
(45) Date of Patent: Mar. 4, 2025

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventors: Shuangshuang Wu, Hefei (CN); Tzung-Han Lee, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 400 days.

(21) Appl. No.: 17/689,000

(22) Filed: Mar. 8, 2022

(65) Prior Publication Data

US 2022/0359291 A1  Nov. 10, 2022

Related U.S. Application Data

(63) Continuation of application No. PCT/CN2021/120247, filed on Sep. 21, 2021.

(30) Foreign Application Priority Data

May 8, 2021 (CN) .......................... 202110500614.6

(51) Int. Cl.
  *H01L 21/768*  (2006.01)
  *H01L 21/304*  (2006.01)
  *H01L 23/48*   (2006.01)

(52) U.S. Cl.
  CPC ...... *H01L 21/76898* (2013.01); *H01L 21/304* (2013.01); *H01L 21/76831* (2013.01); *H01L 21/76832* (2013.01); *H01L 23/481* (2013.01)

(58) Field of Classification Search
  CPC ............. H01L 21/76898; H01L 21/304; H01L 21/76831; H01L 21/76832; H01L 23/481; H01L 21/7684; H01L 23/485; H01L 21/3212
  See application file for complete search history.

(56) References Cited

U.S. PATENT DOCUMENTS

| | | | |
|---|---|---|---|
| 9,287,197 B2 | 3/2016 | Lin et al. | |
| 9,337,125 B2 | 5/2016 | Park et al. | |
| 9,437,547 B2 | 9/2016 | Lin et al. | |
| 10,340,204 B2 | 7/2019 | Kim et al. | |

(Continued)

FOREIGN PATENT DOCUMENTS

| | | |
|---|---|---|
| CN | 103681573 A | 3/2014 |
| CN | 103545275 B | 2/2016 |

(Continued)

OTHER PUBLICATIONS

Supplementary European Search Report in the European application No. 21870475.7, mailed on Dec. 19, 2022, 8 pgs.

(Continued)

*Primary Examiner* — Jonathan Han
(74) *Attorney, Agent, or Firm* — Syncoda LLC; Feng Ma

(57) ABSTRACT

A method for manufacturing a semiconductor structure, including: providing a base; forming a Through Silicon Via (TSV) in the base, with a depth of the TSV being less than a thickness of the base; and forming a liner layer on a sidewall and the bottom of the TSV, and forming a conductive layer in the TSV, the liner layer including a polish-stop layer.

3 Claims, 13 Drawing Sheets

(56) References Cited

U.S. PATENT DOCUMENTS

| | | |
|---|---|---|
| 10,950,523 B2 | 3/2021 | Kim et al. |
| 2011/0316166 A1 | 12/2011 | Yu |
| 2012/0142190 A1 | 6/2012 | Tsao |
| 2012/0248581 A1 | 10/2012 | Sugiyama |
| 2012/0261827 A1* | 10/2012 | Yu .................... H01L 21/76898 |
| | | 438/653 |
| 2014/0070426 A1 | 3/2014 | Park |
| 2014/0264911 A1* | 9/2014 | Lin ...................... H01L 23/535 |
| | | 257/774 |
| 2016/0190066 A1 | 6/2016 | Lin et al. |
| 2017/0256476 A1* | 9/2017 | Kim .................... H01L 23/481 |
| 2019/0279920 A1 | 9/2019 | Kim et al. |
| 2021/0143086 A1 | 5/2021 | Kim et al. |

FOREIGN PATENT DOCUMENTS

| | | |
|---|---|---|
| CN | 107591387 A | 1/2018 |
| TW | 201342526 A | 10/2013 |

OTHER PUBLICATIONS

International Search Report in the international application No. PCT/CN2021/120247, mailed on Dec. 27, 2021, 2 pgs.

\* cited by examiner

SEMICONDUCTOR STRUCTURE AND METHOD FOR MANUFACTURING SEMICONDUCTOR STRUCTURE

CROSS-REFERENCE TO RELATED APPLICATION

This is a continuation application of International Patent Application No. PCT/CN2021/120247, filed on Sep. 24, 2021, which claims priority to Chinese Patent Application No. 202110500614.6, entitled "SEMICONDUCTOR STRUCTURE AND METHOD FOR MANUFACTURING SEMICONDUCTOR STRUCTURE" and filed on May 8, 2021. The disclosures of International Patent Application No. PCT/CN2021/120247 and Chinese Patent Application No. 202110500614.6 are incorporated by reference herein in their entireties.

TECHNICAL FIELD

The disclosure relates to the field of semiconductor devices and manufacturing thereof, and in particular, to a semiconductor structure and a method for manufacturing same.

BACKGROUND

With the development of semiconductor technologies, the feature size of an integrated circuit keeps decreasing, and the device interconnection density keeps increasing. Conventional two-dimensional packaging can no longer meet the needs of the industry. Therefore, a Through Silicon Via (TSV)-based vertical interconnect stacking packaging method gradually becomes the development trend of packaging technologies for its key technical advantages of short-range interconnection and high-density integration.

In an existing TSV technology, during the polishing after a metal material is filled in a TSV, a polishing rate and a polishing thickness cannot be effectively controlled, and an excessive polishing tends to occur.

SUMMARY

According to various embodiments of the disclosure, a semiconductor structure and a method for manufacturing same are provided.

According to a first aspect of embodiments of the present disclosure, there is provided a method for manufacturing a semiconductor structure, including: providing a base; forming a TSV in the base, with a depth of the TSV being less than a thickness of the base; and forming a liner layer on a sidewall and the bottom of the TSV, and forming a conductive layer in the TSV, the liner layer including a polish-stop layer.

According to a second aspect of embodiments of the present disclosure, there is provided a semiconductor structure including a base, a TSV located in the base, a liner layer at least located on a sidewall and the bottom of the TSV and a conductive layer. A depth of the TSV is less than a thickness of the base. The liner layer includes a polish-stop layer. The conductive layer is located in the TSV and entirely fills the TSV.

BRIEF DESCRIPTION OF THE DRAWINGS

To describe the technical solutions in the embodiments of the disclosure more clearly, the following briefly introduces the accompanying drawings required for describing the embodiments. Apparently, the accompanying drawings in the following description show merely some embodiments of the disclosure, and a person of ordinary skill in the art may still derive the drawings of other embodiments from these accompanying drawings without creative efforts.

DETAILED DESCRIPTION

For ease of understanding of the disclosure, the disclosure is described more completely below with reference to the accompanying drawings. The preferred embodiments of the disclosure are given in the accompanying drawings. However, the disclosure may be implemented in various forms, and is not limited to the embodiments described herein. Rather, these embodiments are provided so that the disclosed content of the disclosure will be understood more thoroughly and completely.

Unless otherwise defined, the technical terms and scientific terms used herein have the same meanings as how they are generally understood by a person skilled in the art to which the disclosure pertains. The terms used herein in the specification of the disclosure are merely used for describing specific embodiments, but are not intended to limit the disclosure. The term "and/or" used herein encompasses any and all possible combinations of one or more of the associated listed items.

In describing the location relationship, unless otherwise specified, when an element such as a layer, membrane or substrate is referred to as being "on" another membrane layer, it can be directly on the other membrane layer or there may be an intermediate membrane layer. Further, when a layer is referred to as being "under" another layer, it may be directly below, or there may be one or more intermediate layers. It is also understood that when a layer is referred to as being "between" two layers, it may be the only layer between the two layers, or there may be one or more intermediate layers.

In the case in which "comprise," "have," and "include" described herein are used, another part may also be added unless explicit limitative terms such as "only" and "formed by . . . " are used. The terms in a singular form may include plural forms unless noted to the contrary, and cannot be understood that there is the quantity is 1.

Figure 1:
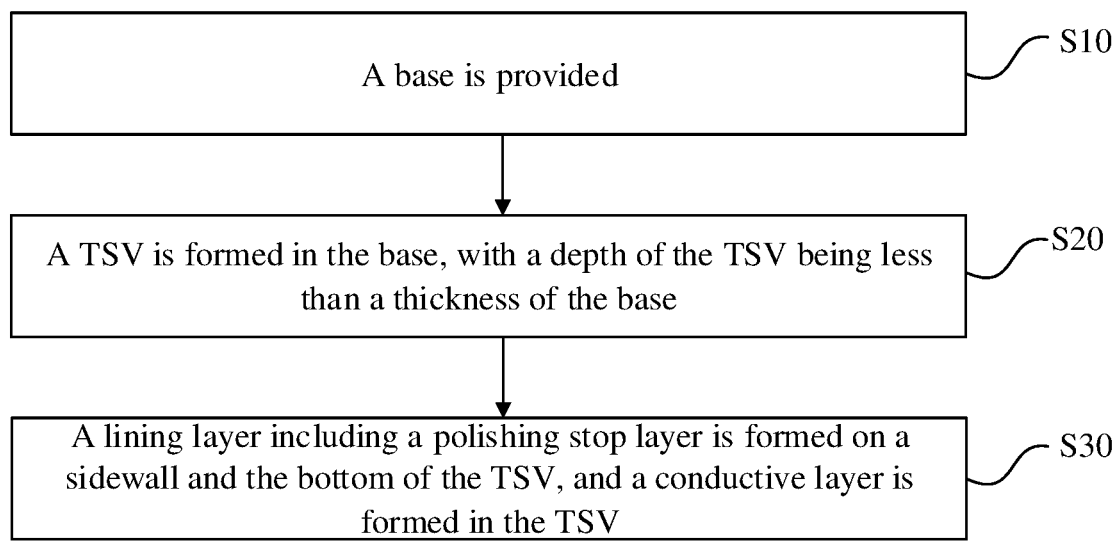
FIG. 1 is a flowchart of a method for manufacturing a semiconductor structure according to an embodiment of the disclosure.

In an existing TSV technology, during the polishing performed after a metal material is filled in a TSV, a polishing rate and a polishing thickness cannot be effectively controlled, and a problem of the excessive polishing tends to occur. In view of the foregoing problem, an embodiment of the disclosure provides a method for manufacturing a semiconductor structure. As shown in FIG. 1, the method includes the following operations.

At S10, a base 11 is provided.

Figure 2:
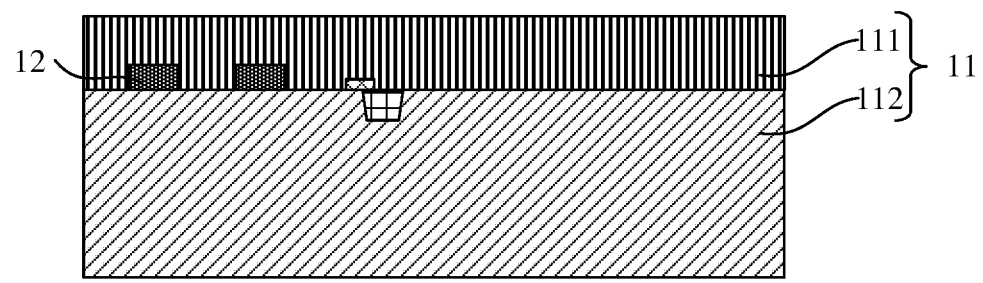
FIG. 2 is a schematic sectional view of a substrate according to an embodiment of the disclosure.

In an example, as shown in FIG. 2, the base 11 may include a substrate 112 and a first dielectric layer 111 on an upper surface of the substrate 112. A plurality of device units 12 arranged in an array are formed in the first dielectric layer 111. The device units 12 may be memory cells. The first dielectric layer 111 may be a silicon nitride layer or a silicon oxide layer. Optionally, a planarization process (for example, a chemical mechanical polishing process), may be performed on an upper surface of the first dielectric layer 111.

At S20, a TSV 13 is formed in the base 11, a depth of the TSV 13 is less than a thickness of the base 11.

Figure 3:
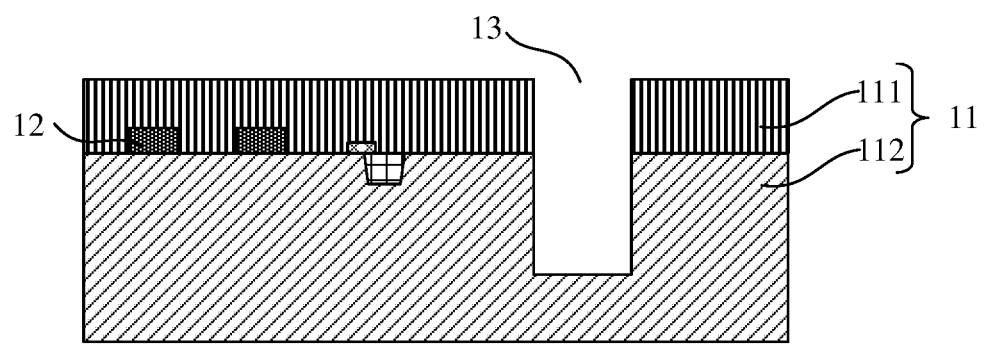
FIG. 3 is a schematic sectional view of a semiconductor structure obtained after a TSV is formed according to an embodiment of the disclosure.

Specifically, the base 11 includes an array region and a peripheral region located on a periphery of the array region. The TSV 13 in this embodiment is formed in the peripheral region. In an example, the TSV 13 may be formed in the peripheral region of the base 11 by a photolithography process. As shown in FIG. 3, the TSV 13 passes through the first dielectric layer 111, and partially extends into the substrate 112.

At S30, a liner layer is formed on a sidewall and the bottom of the TSV 13, and a conductive layer 15 is formed in the TSV 13. The liner layer includes a polish-stop layer.

Figure 4:
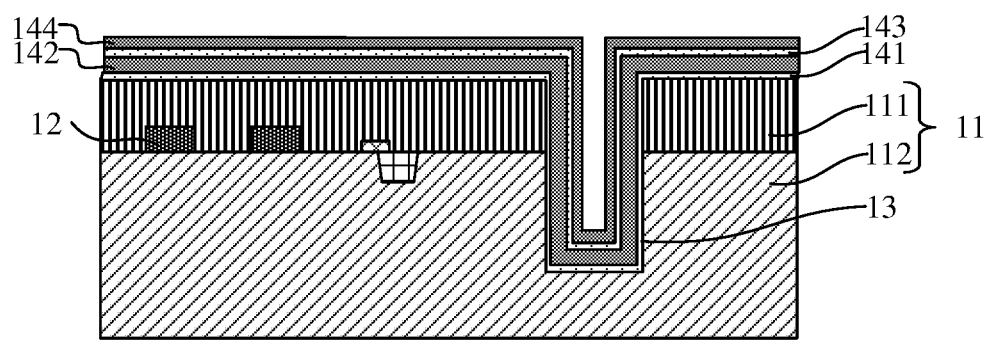
FIG. 4 is a schematic sectional view of a semiconductor structure obtained after a liner layer is formed according to an embodiment of the disclosure.
Figure 5:
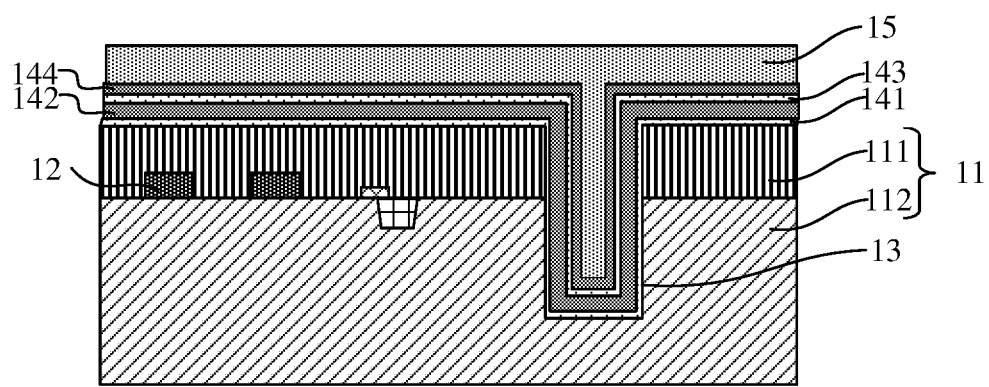
FIG. 5 is a schematic sectional view of a semiconductor structure obtained after a conductive layer is formed on an upper surface of a second dielectric filler layer and in a TSV according to an embodiment of the disclosure.

Specifically, the liner layer includes a dielectric filler layer and the polish-stop layer that are sequentially stacked onto one another. As shown in FIG. 4 and FIG. 5, the operations of forming the liner layer and the conductive layer 15 are as follows.

At S31, a first polish-stop layer 141 is formed on an upper surface of the base 11 as well as the sidewall and bottom of the TSV 13.

At S32, a first dielectric filler layer 142 is formed on a surface of the first polish-stop layer 141.

At S33, a second polish-stop layer 143 is formed on a surface of the first dielectric filler layer 142.

At S34, a second dielectric filler layer 144 is formed on a surface of the second polish-stop layer 143.

At S35, the conductive layer 15 is formed on a surface of the second dielectric filler layer 144, the conductive layer 15 covers an upper surface of the second dielectric filler layer 144 and entirely fill the TSV 13.

At S36, a portion of the conductive layer 15 located above the first polish-stop layer 141, a portion of the second dielectric filler layer 144 located above the first polish-stop layer 141, a portion of the second polish-stop layer 143 located above the first polish-stop layer 141, and a portion of the first dielectric filler layer 142 located above first polish-stop layer 141 are removed.

The first dielectric filler layer 142 and the second dielectric filler layer 144 may be silicon oxide layers. The first polish-stop layer 141 and the second polish-stop layer 143 may be silicon nitride layers or silicon carbon nitride layers. The conductive layer 15 may be a copper layer.

In an example, FIG. 4 is a schematic structural sectional view of a semiconductor structure obtained after the liner layer is formed on the sidewall and bottom of the TSV 13. FIG. 5 is a schematic sectional view of a semiconductor structure formed after the conductive layer 15 covers the upper surface of the second dielectric filler layer 144 and fills the TSV 13. The conductive layer 15 may be formed on the surface of the second dielectric filler layer 144 by an electroplating process. Optionally, after the first polish-stop layer 141, the first dielectric filler layer 142, the second polish-stop layer 143, the second dielectric filler layer 144, and the conductive layer 15 are formed, the method may further include a operation of performing a planarization process, for example, chemical mechanical polishing, on surfaces of the above material layers.

In the foregoing method for manufacturing a semiconductor structure, the polish-stop layer is added in a manufacturing process of the liner layer, so that a polishing progress may be determined by the polish-stop layer and the polishing rate may be adjusted in time in a subsequent polishing process, to prevent excessive polishing and the damage to the conductive layer 15 in the TSV 13.

In an embodiment, after the portions of the conductive layer 15 and the second dielectric filler layer 144 located above the first polish-stop layer 141 are removed and before a portion of the second polish-stop layer 143 located above the first polish-stop layer 141 is removed, the method further includes the following operations.

At S361, an interconnection through hole 16 is formed, to expose the device units 12.

Figure 6:
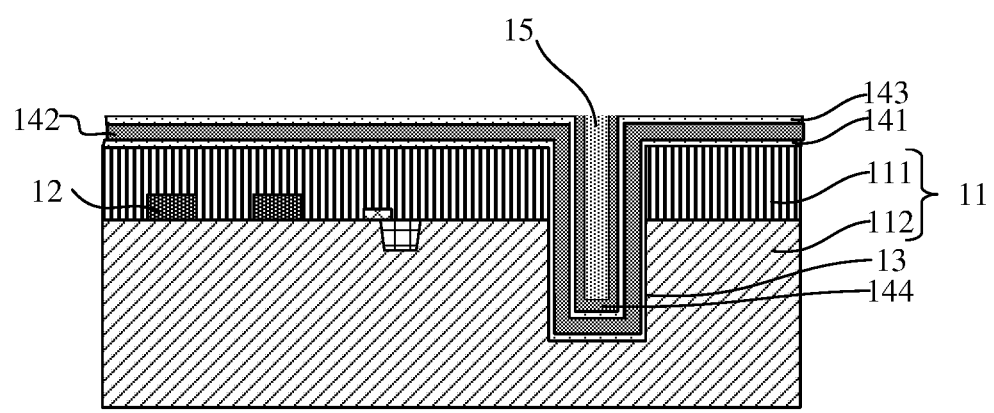
FIG. 6 is a schematic sectional view of a semiconductor structure obtained after a conductive layer is formed in a TSV according to an embodiment of the disclosure.
Figure 7:
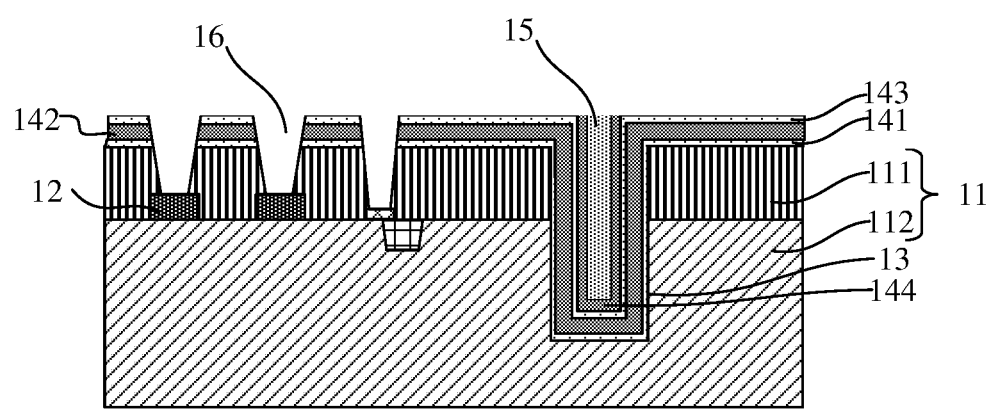
FIG. 7 is a schematic structural view of a semiconductor structure obtained after an interconnection through hole is formed according to an embodiment of the disclosure.

FIG. 6 is a schematic sectional view of a semiconductor structure formed after portions of the conductive layer 15 and the second dielectric filler layer 144 located above the second polish-stop layer 143 are removed. To form the interconnection through hole 16, a photoresist layer with a photolithography pattern may be formed on the structure shown in FIG. 6. A position of the photolithography pattern corresponds to the device units 12 in the first dielectric layer 111. Then the second polish-stop layer 143, the first dielectric filler layer 142, the first polish-stop layer 141, and the first dielectric layer 111 are etched in accordance with the photolithography pattern, to form the interconnection through hole 16, as shown in FIG. 7.

At S362, an interconnection material layer 17 is formed in the interconnection through hole 16 and on an upper surface of the second polish-stop layer 143.

Figure 8:
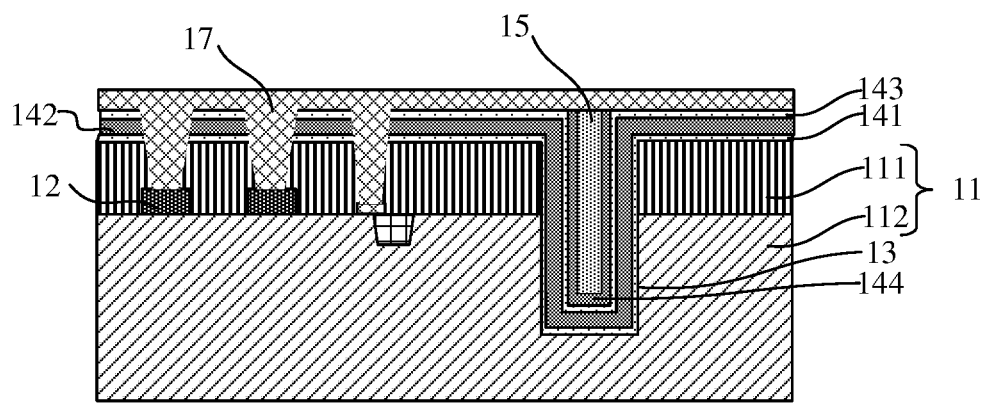
FIG. 8 is a schematic sectional view of a semiconductor structure obtained after an interconnection material layer is formed according to an embodiment of the disclosure.

In an example, the interconnection material layer 17 may be at least one of a tungsten layer, an aluminum layer, a copper layer or a titanium nitride layer. FIG. 8 is a schematic sectional view of a semiconductor structure obtained after the interconnection material layer 17 is formed.

At S363, a portion of the interconnection material layer 17 located on the upper surface of the second polish-stop layer 143 is removed.

At S364, while the portion of the second polish-stop layer 143 above the first polish-stop layer 141 and the portion of the first dielectric filler layer 142 located above the first polish-stop layer 141 are removed, a portion of the interconnection material layer 17 located above the first polish-stop layer 141 is removed. A portion of the interconnection material layer 17 retained in the interconnection through hole 16 forms an interconnection structure 18, an upper surface of the interconnection structure 18 is flush with an upper surface of the first polish-stop layer 141.

Figure 9:
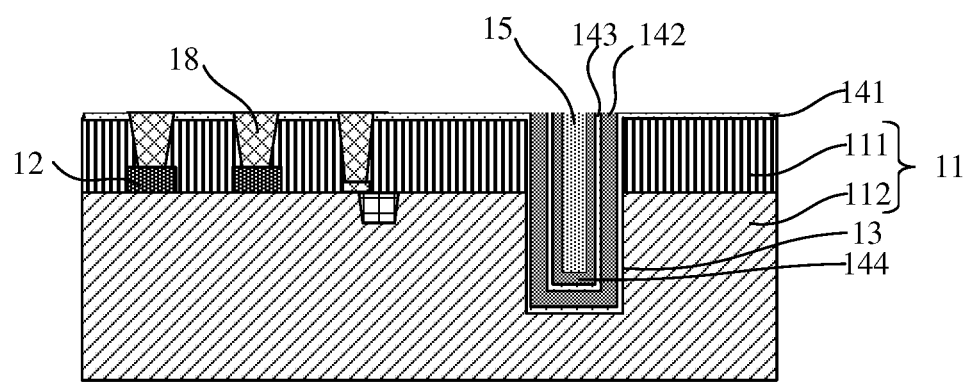
FIG. 9 is a schematic sectional view of a semiconductor structure obtained after an interconnection structure is formed according to an embodiment of the disclosure.

To form the interconnection structure 18, the excessive interconnection material layer 17 needs to be removed. Specifically, at first, a polishing device is controlled to polish the portion of the interconnection material layer 17 located on the upper surface of the second polish-stop layer 143, to remove this portion of the interconnection material layer 17. When the polishing device comes into contact with the second polish-stop layer 143, a polishing resistance changes. For example, the polishing resistance significantly increases. In this case, the polishing device will be controlled to lower the polishing rate of the polishing device, then the polishing is continued to remove the portions of second polish-stop layer 143 and the first dielectric filler layer 142 located above the first polish-stop layer 141. Finally, when the polishing device comes into contact with the first polish-stop layer 141, the polishing resistance changes again. In this case, the polishing device is controlled to stop polishing, to obtain the interconnection structure 18. FIG. 9 is a schematic sectional view of a semiconductor structure obtained after the interconnection structure 18 is formed. The upper surface of the interconnection structure 18 is flush with the upper surface of the first polish-stop layer 141. The interconnection structure 18 may be at least one of a tungsten layer, an aluminum layer, a copper layer or a titanium nitride layer.

In an embodiment, the forming the interconnection structure 18 further includes the following operations.

At S365, a second dielectric layer 19 is formed on the upper surface of the first polish-stop layer 141, the upper surface of the interconnection structure 18, an upper surface of the liner layer, and an upper surface of the conductive layer 15.

Figure 10:
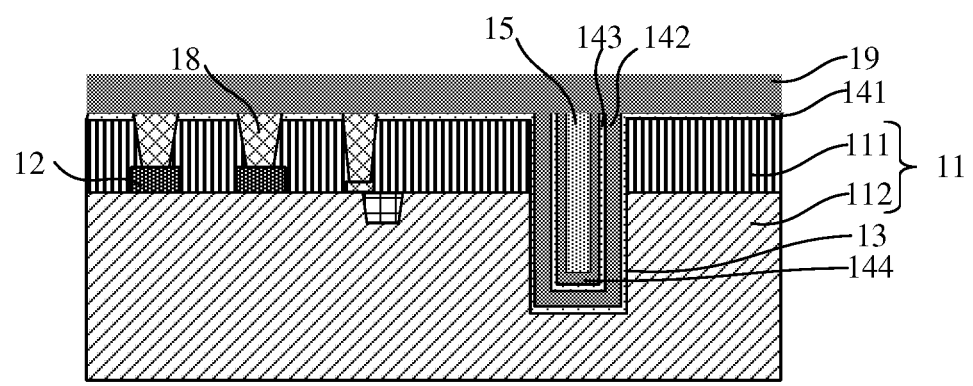
FIG. 10 is a schematic sectional view of a semiconductor structure obtained after a second dielectric layer is formed according to an embodiment of the disclosure.

In an example, FIG. 10 is a schematic sectional view of a semiconductor structure obtained after the second dielectric layer 19 is formed. A material of the second dielectric layer 19 may be the same as a material of the first dielectric filler layer 142 or the second dielectric filler layer 144. That is, the second dielectric layer 19 may be a silicon oxide layer.

At S366, trenches 20 are formed in the second dielectric layer 19 to expose the interconnection structure 18 and the conductive layer 15 respectively.

Figure 11:
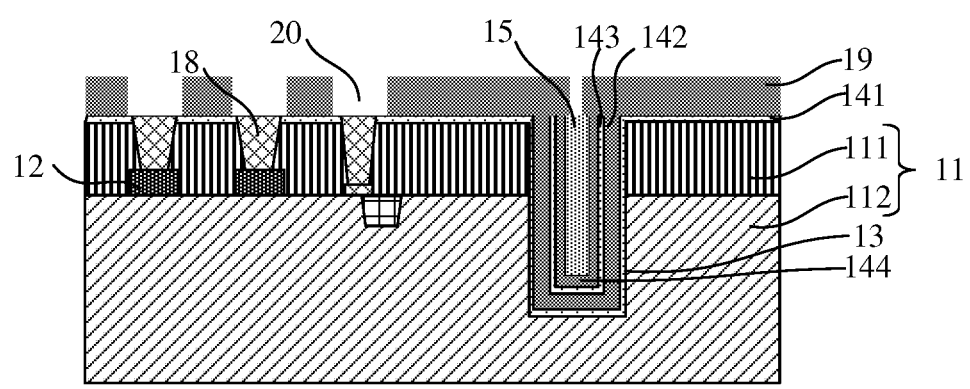
FIG. 11 is a schematic sectional view of a semiconductor structure obtained after trenches are formed in a second dielectric layer according to an embodiment of the disclosure.

In an example, FIG. 11 is a schematic sectional view of a semiconductor structure obtained after the trenches 20 are formed. The trenches 20 may be formed by a photolithography process.

At S367, a metal layer 21 is formed in the trenches 20.

Optionally, the metal layer 21 may be a copper layer. The metal layer 21 is first formed in the trenches 20 and on an upper surface of the second dielectric layer 19 by an electroplating process. A portion of the metal layer 21 on the upper surface of the second dielectric layer 19 is then removed by a chemical mechanical polishing process. A portion of the metal layer 21 in the trench 20 is retained, and a surface of the metal layer 21 is planarized, to enable the metal layer 21 in the trench 20 to be flush with the upper surface of the second dielectric layer 19.

In an embodiment, after the conductive layer 15 is formed in the TSV 13, the method further includes the following operations.

At S40, the substrate 112 is thinned from a back side, until the bottom of the conductive layer 15 is exposed.

The bottom of the conductive layer 15 is exposed, to enable different wafers to be connected by the conductive layer 15 in the TSV 13, so as to implement a vertical interconnect stacking packaging. Specifically, the thinning of the substrate 112 from the back side includes the following operations.

At S41, the substrate 112 is thinned from a back side by polishing at a first polishing rate, until the polish-stop layer is exposed.

At S42, the substrate 112 is continued to be thinned from the back side by polishing at a second polishing rate, until the bottom of the conductive layer 15 is exposed.

The second polishing rate is less than the first polishing rate.

For example, at first, back side of the substrate 112 is polished at the first polishing rate to reduce the thickness of the substrate. When the polishing device comes into contact with the first polish-stop layer 141, a signal indicating that the polishing resistance increases may be detected, and thus the first polish-stop layer 141 is identified. The polishing rate is lowered to the second polishing rate, then the polishing continues with the second polishing rate. When the polishing device comes into contact with the second polish-stop layer 143, a signal indicating that the polishing resistance increases may be detected again, and thus the second polish-stop layer 143 is identified. Optionally, the polishing device may continue to perform polishing at the second polishing rate, until the bottom of the conductive layer 15 is exposed. Optionally, the polishing device may also lower the polishing rate to a third polishing rate, to continue to perform the polishing at the third polishing rate, until the bottom of the conductive layer 15 is exposed. The third polishing rate is less than the second polishing rate, and the second polishing rate is less than the first polishing rate. The semiconductor structure, obtained after the substrate 112 is thinned from a back side to expose the bottom of the conductive layer 15, is shown in the schematic structural sectional view of FIG. 13.

In the method for manufacturing a semiconductor structure, the polish-stop layer is disposed in the liner layer of the TSV 13, so that during the thinning of the substrate 112 from the back side, a polishing progress may be determined by detecting whether the polishing device comes into contact with the polish-stop layer, and the polishing rate may be adjusted in time, to avoid an phenomenon of excessive polishing, thereby preventing the conductive layer 15 from damage and avoiding affecting the electrical performance of the conductive layer 15.

In an embodiment, a width of the interconnection through hole 16 is less than a width of the TSV 13. The interconnection through hole 16 is located in the array region, a size of the interconnection through hole 16 usually corresponds to a size of the device unit 12. Because the feature size of the device unit 12 keeps decreasing, the size of the interconnection through hole 16 also correspondingly decreases. The TSV 13 is located on a periphery of the array region, and there is no direct relation between the TSV and the size of the device unit 12. The width of the TSV 13 may be appropriately increased, to enable the width of the TSV 13 to be greater than the width of the interconnection through hole 16, so that a resistance of the conductive layer 15 in the TSV 13 can be reduced.

Figure 12:
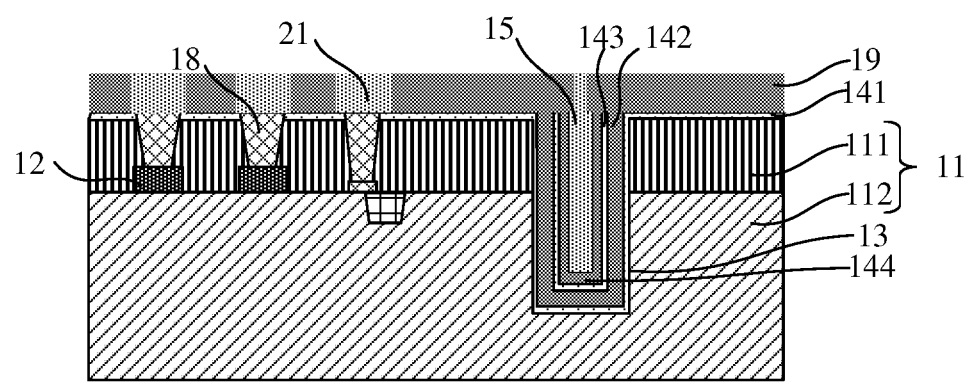
FIG. 12 is a schematic sectional view of a semiconductor structure obtained after a metal layer is formed according to an embodiment of the disclosure.

Another embodiment of the disclosure further discloses a semiconductor structure. As shown in FIG. 12, the semiconductor structure includes: a base 11, a TSV 13 located in the base 11, a liner layer and a conductive layer 15. A depth of the TSV 13 is less than a thickness of the base 11. The liner layer is located at least on a sidewall and the bottom of the TSV 13, and the liner layer includes a polish-stop layer. The conductive layer is located in the TSV 13, and entirely fills the TSV 13.

Specifically, as shown in FIG. 12, the base 11 may include a substrate 112 and a first dielectric layer 111 on an upper surface of the substrate 112. A plurality of device units 12 formed in the first dielectric layer 111 are arranged in an array. The device units 12 may be memory cells or may be a front trench isolation structure. The first dielectric layer 111 may be a silicon nitride layer or a silicon oxide layer. The TSV 13 passes through the first dielectric layer 111, and partially extends into the substrate 112.

In an example, as shown in FIG. 12, a part of the liner layer is located on the sidewall and bottom of the TSV 13, and another part is located on an upper surface of the first dielectric layer 111. The liner layer includes the polish-stop layer. The function of the polish-stop layer lies in that: during the polishing of a back surface (that is, a surface close to the bottom of the TSV 13) of the base 11, a polishing rate may be adjusted in time according to a position of the polish-stop layer, to avoid excessive polishing, so that the precision is increased while the polishing efficiency is improved. For example, before the polishing device comes into contact with the polish-stop layer, the polishing may be performed at a relatively fast polishing rate. There is no risk that the conductive layer 15 will be damaged by the excessive polishing. When the polishing device comes into contact with the polish-stop layer, the polishing device receives a signal indicating that a polishing resistance changes. Then, a user may determine a current progress of the polishing, that is, the polishing device already approaches the bottom of the conductive layer 15, and may appropriately decrease a polishing rate, to perform more accurate polishing.

In an embodiment, the liner layer includes a first polish-stop layer 141, a first dielectric filler layer 142, a second polish-stop layer 143, and a second dielectric filler layer 144 that are sequentially stacked onto one another in a direction from the base 11 to the conductive layer 15.

Continuing to refer to FIG. 12, two polish-stop layers are disposed in the liner layer. The polishing device may more precisely adjust the polishing rate by means of the first polish-stop layer 141 and the second polish-stop layer 143, thereby further improving the polishing efficiency and polishing precision. For example, at first, the substrate 112 may be thinned by polishing the back surface at a first polishing rate. When the polishing device comes into contact with the first polish-stop layer 141, a signal indicating an increase in the polishing resistance may be detected, and thus the first polish-stop layer 141 is identified. Then the polishing device is controlled to lower the polishing rate to a second polishing rate. Then, the polishing continues with the second polishing rate. When the polishing device comes into contact with the second polish-stop layer 143, a signal indicating that an increase in the polishing resistance may be detected again, and thus the second polish-stop layer 143 is identified. Optionally, the polishing device may continue to perform polishing at the second polishing rate, until the bottom of the conductive layer 15 is exposed. Optionally, the polishing device may also lower the polishing rate to a third polishing rate, to continue to perform the polishing at the third polishing rate, until the bottom of the conductive layer 15 is exposed. The third polishing rate is less than the second polishing rate, and the second polishing rate is less than the first polishing rate. In the semiconductor structure in this embodiment, a plurality of polish-stop layers are disposed. The user may perform polishing at a relatively fast speed with confidence before the polishing device comes into contact with the next polish-stop layer without worrying about the excessive polishing. The polishing rate is adjusted only after the polishing device comes into contact with the polish-stop layer, to perform more cautious and precise polishing, so that the polishing efficiency is improved while the polishing precision is ensured.

In an embodiment, the first dielectric filler layer 142 and the second dielectric filler layer 144 both include a silicon oxide layer. The first polish-stop layer 141 and the second polish-stop layer 143 both include a silicon nitride layer or a silicon carbon nitride layer.

In an example, the polish-stop layer is a silicon nitride ($Si_3N_4$) layer. Silicon nitride is a structural ceramic material, has a high hardness and wear resistance, and is very suitable for use as a mask stop layer. When the polishing device comes into contact with the silicon nitride layer, the polishing device may detect an increase in the polishing resistance, thereby prompting the user to lower the polishing rate, to avoid the excessive polishing.

In an embodiment, the base 11 includes an array region and a peripheral region located on a periphery of the array region. The TSV 13 is located in the peripheral region. As shown in FIG. 12, the base 11 includes the substrate 112 and the first dielectric layer 111 located on the upper surface of the substrate 112. The plurality of device units 12 arranged in an array are formed in the first dielectric layer 111 in the array region. The first polish-stop layer 141 extends to the upper surface of the first dielectric layer 111. The semiconductor structure further includes an interconnection structure 18, a second dielectric layer 19 and a metal layer 21. The bottom of the interconnection structure 18 is in contact with the device units 12, an upper surface of the interconnection structure 18 is flush with an upper surface of the first polish-stop layer 141. The second dielectric layer 19 is located on the upper surface of the first polish-stop layer 141, an upper surface of the liner layer, and an upper surface of the conductive layer 15. The metal layer 21 is located in the second dielectric layer 19, and in contact with the device units 12 and the conductive layer 15.

Specifically, as shown in FIG. 12, the metal layer 21 includes a plurality of metal structures, which are in contact with the interconnection structure 18 and the conductive layer 15 respectively. The metal layer 21 includes a copper metal structure. The interconnection structure 18 includes at least one of a tungsten layer, an aluminum layer, a copper layer or a titanium nitride layer. The device units 12 include memory cells. The first dielectric layer 111 includes a silicon nitride layer or a silicon oxide layer. The second dielectric layer 19 includes a silicon oxide layer.

Figure 13:
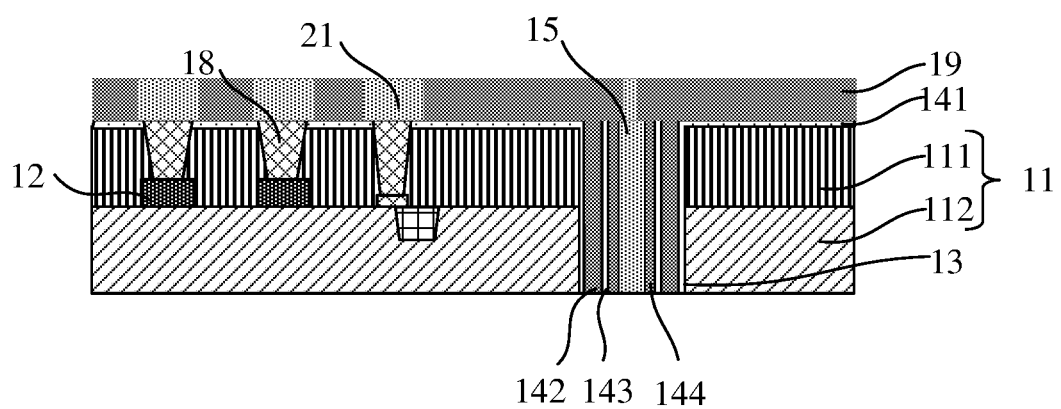
FIG. 13 is a schematic sectional view of a semiconductor structure obtained after a substrate is thinned from a back side according to an embodiment of the disclosure.

An embodiment of the disclosure further discloses a semiconductor structure. As shown in FIG. 13, the semiconductor structure includes: a base 11, a TSV 13 located in the base 11, a liner layer at least located on a sidewall of the TSV 13 and a conductive layer 15. A depth of the TSV 13 is equal to a thickness of the base 11. The liner layer includes a polish-stop layer. The conductive layer is located in the TSV 13, and entirely fills the TSV 13.

In the semiconductor structure, the polish-stop layer is formed in the liner layer of the TSV, so that a polishing progress may be determined by the polish-stop layer and a polishing rate may be adjusted in time in a process of polishing a back surface of the base to penetrate the TSV, to prevent damage to the conductive layer in the TSV due to the excessive polishing.

The technical features in the foregoing embodiments may be randomly combined. For simplicity of description, all possible combinations of the technical features in the foregoing embodiments are not described. However, it should be considered that these combinations of technical features fall within the scope recorded in the specification provided that these combinations of technical features do not have any conflict.

The foregoing embodiments only describe several embodiments of the disclosure, and their description is specific and detailed, but cannot therefore be understood as a limitation to the claims. It should be noted that for a person of ordinary skill in the art, several variations and improvements may further be made without departing from the concept of the disclosure. These variations and improvements should also be deemed as falling within the scope of protection of the disclosure. Therefore, the scope of protection of the patent of the disclosure shall be subject to the appended claims.

The invention claimed is:

1. A semiconductor structure, comprising:
a base comprising an array region and a peripheral region located on a periphery of the array region, the base comprises a substrate and a first dielectric layer located on an upper surface of the substrate;
a Through Silicon Via (TSV) located in the peripheral region, the TSV passes through the first dielectric layer, and partially extends into the substrate;
a liner layer at least located on a sidewall and a bottom of the TSV;
a conductive layer, located in the TSV and entirely filling the TSV, wherein the liner layer comprising a first polish-stop layer, a first dielectric filler layer, a second polish-stop layer and a second dielectric filler layer that are sequentially stacked onto one another in a direction from the substrate to the conductive layer, the first polish-stop layer extends to an upper surface of the first dielectric layer;
a plurality of device units arranged in an array are formed in the first dielectric layer in the array region;
an interconnection structure, the interconnection structure passes through the first dielectric layer, a bottom of the interconnection structure being in contact with the device units, an upper surface of the interconnection structure being flush with an upper surface of the first polish-stop layer;
a second dielectric layer, located on the upper surface of the first polish-stop layer, an upper surface of the liner layer and an upper surface of the conductive layer; and
a metal layer, located in the second dielectric layer and in contact with the device units and the conductive layer.

2. The semiconductor structure according to claim 1, wherein
each of the first dielectric filler layer and the second dielectric filler layer comprises a silicon oxide layer, and each of the first polish-stop layer and the second polish-stop layer comprises a silicon nitride layer or a silicon carbon nitride layer.

3. The semiconductor structure according to claim 1, wherein
the first dielectric layer comprises a silicon nitride layer or a silicon oxide layer, the second dielectric layer comprises a silicon oxide layer, the interconnection structure comprises at least one of a tungsten layer, an aluminum layer, a copper layer or a titanium nitride layer; and the device units comprise memory cells.

* * * * *